(12) United States Patent
Abbasi et al.

(10) Patent No.: US 6,859,108 B2
(45) Date of Patent: Feb. 22, 2005

(54) CURRENT BIASED PHASE LOCKED LOOP

(75) Inventors: Saeed Abbasi, Narberth, PA (US);
Martin E. Perrigo, Newton, PA (US);
Carol A. Price, Jamison, PA (US)

(73) Assignee: ATI Technologies, Inc., Thornhill (CA)

( * ) Notice: Subject to any disclaimer, the term of this patent is extended or adjusted under 35 U.S.C. 154(b) by 0 days.

(21) Appl. No.: 10/376,817

(22) Filed: Feb. 28, 2003

(65) Prior Publication Data

US 2004/0169563 A1 Sep. 2, 2004

(51) Int. Cl.[7] .......... H03L 7/085; H03L 7/089; H03L 7/099; H03L 7/107
(52) U.S. Cl. .......... 331/17; 31/1 A; 31/8; 31/25; 31/179; 327/156; 327/157; 327/159
(58) Field of Search .......... 331/1 A, 8, 10, 331/11, 12, 16, 17, 18, 25, 177 R, 179; 327/156–159; 332/127; 360/51; 375/376; 455/260

(56) References Cited

U.S. PATENT DOCUMENTS 5,986,485 A * 11/1999 O'Sullivan .......... 327/156
6,411,142 B1   6/2002 Abbasi et al.

OTHER PUBLICATIONS

U.S. patent application Ser. No. 09/730,954, Abbassi et al., filed Dec. 6, 2000.

* cited by examiner

*Primary Examiner*—David Mis
(74) *Attorney, Agent, or Firm*—Toler, Larson & Abel, LLP (57) ABSTRACT

A phase locked loop (PLL) circuit adjusts a voltage controlled differential oscillator to generate an output frequency signal that is a selected multiple of an input reference signal. An oscillator control circuit increases and decreases the output frequency signal. A frequency detector detects a phase shift between the reference signal and the PLL output signal and produces an error signal. In response to the error signal, a fast lock circuit detects when the output frequency signal passes the selected multiple of the reference signal.

16 Claims, 8 Drawing Sheets

| UP | DOWN | Q1 | Q2 | Q3 |
|---|---|---|---|---|
| 0 | 0 | 0 | 0 | 1 |
| 0 | 1 | 0 | 1 | 1 |
| 1 | 1 | 0 | 1 | 1 |
| 0 | 0 | 0 | 1 | 1 |
| 0 | 1 | 0 | 1 | 1 |
| 1 | 1 | 0 | 1 | 1 |
| ... | ... | ... | ... | 1 |
| 0 | 0 | 0 | 1 | 1 |
| 1 | 0 | 1 | 1 | 0 |
| 1 | 1 | 1 | 1 | 0 |
| 1 | 1 | 1 | 1 | 0 |
| ... | ... | ... | ... | 0 |
| 0 | 0 | 1 | 1 | 0 |
| 0 | 1 | 1 | 1 | 0 |
| 1 | 1 | 1 | 1 | 0 |
| ... | ... | ... | ... | 0 |
| 0 | 0 | 1 | 1 | 0 |
| 1 | 0 | 1 | 1 | 0 |
| 1 | 1 | 1 | 1 | 0 |
| ... | ... | ... | ... | 0 |

CURRENT BIASED PHASE LOCKED LOOP

CO-PENDING APPLICATION

This application is related to U.S. patent application Ser. No. 09/730,954 entitled "COMMON BIAS AND DIFFERENTIAL STRUCTURE BASED PLL WITH FAST LOCKUP CIRCUIT AND CURRENT RANGE CALIBRATION FOR PROCESS VARIATION" filed on Dec. 6, 2000.

BACKGROUND

The present invention relates generally to phase locked loop (PLL) circuits. More particularly, this invention relates to a PLL circuit which is based on a voltage controlled differential oscillator and an advanced common biasing technique, which tolerates process variations and calibrates current ranges for operational request frequency that provides frequency stability with temperature change without the use of a bandgap reference bias circuit.

Phase-locked loops are often used in the I/O interfaces of digital integrated circuits in order to hide clock distribution delays and to improve overall system timing. The maintenance of the timing throughout a circuit is important. Timing becomes particularly critical for applications requiring high-speed processing of information, such as with video processors.

The timing throughout a circuit deviates from the system clock when noise is introduced by various system components and as a result of capacitive effects due to system interconnections. In recent years, the demand has risen for devices capable of high-speed processing. As a result, the demand for PLL circuits that quickly compensate for electronic noise and capacitive delays has also risen. The problem is that the amount of phase shift produced as a result of the supply, substrate noise and capacitor load is directly related to how quickly the PLL can correct the output frequency.

Figure 1:
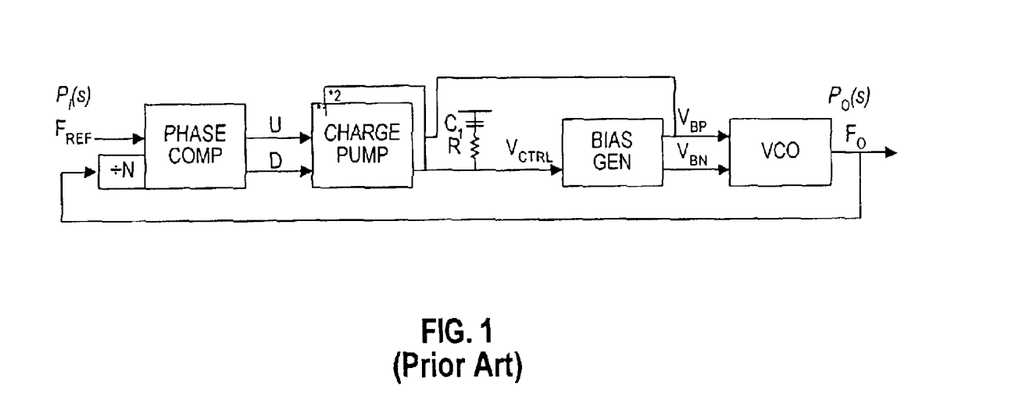
FIG. 1 is a typical PLL block diagram.

One type of design used by those skilled in the art to eliminate the noise present in the circuit at the required speed is a self-bias signal technique. Referring to FIG. 1, this prior art PLL circuit is a self-biasing configuration which is composed of a phase comparator, charge pump, loop filter, bias generator and a voltage-controlled oscillator (VCO). This PLL circuit also uses an additional charge pump current to the bias generator $V_{bp}$ output. For a typical PLL, the charge pump current and the loop filter resistance are constant. These conditions give rise to a constant damping factor and a constant loop bandwidth. A constant loop bandwidth can constrain the achievement of a wide operating frequency range and low input tracking jitter. If the frequency is disturbed, the phase error that results from each cycle of the disturbance will accumulate for many cycles until the loop can compensate for the frequency error. The error will be accumulated for a number of cycles, which is proportional to the operating frequency divided by the loop bandwidth. Thus the loop bandwidth would have to be positioned as close as possible to the reference frequency bandwidth to minimize the total phase error. The result is that the frequency bandwidth must be conservatively set for stability at the lowest operating frequency with worst case process variations, rather than set for optimized jitter performance. The self-biased PLL also exhibits much faster locking times only when locking from similar or higher operating frequencies. If, however, the self-biased PLL is started at a very low operating frequency, it will exhibit very slow locking times.

Accordingly, there is a need for a PLL circuit that provides a fast lock-up, improved jitter performance, tolerates process variations, and extends the PLL operating frequency range.

DESCRIPTION OF THE PREFERRED EMBODIMENT(S)

The first embodiment of the present invention will be described with reference to the drawing figures wherein like numerals represent like elements throughout.

Figure 2:
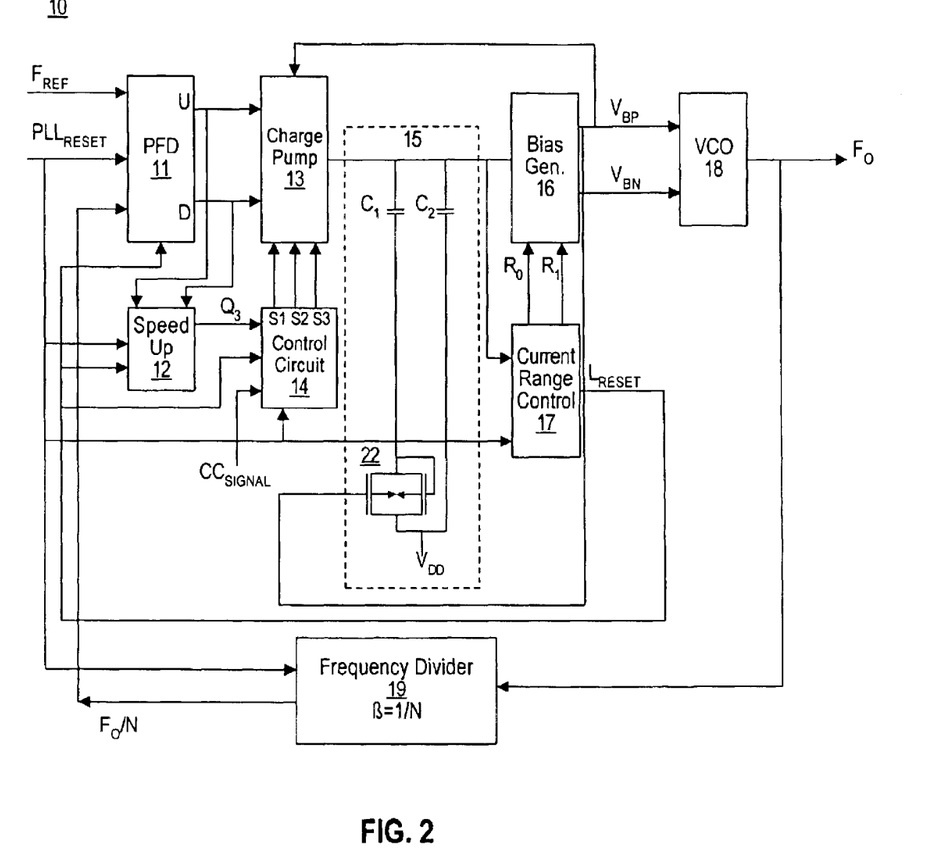
FIG. 2 is a block diagram of the circuit in accordance with the preferred embodiment of the present invention.

Referring to FIG. 2, a PLL circuit 10 made in accordance with the present invention is shown. The PLL circuit 10 includes a phase frequency detector (PFD) 11, a speed-up circuit 12, a charge pump 13, a charge pump control circuit 14, a loop filter 15, a bias generator 16, a current range control circuit 17, a voltage-controlled oscillator (VCO) 18, and a frequency divider 19. The PLL circuit 10 receives a reference frequency $F_{ref}$ from an outside source. Along with the reference frequency $F_{ref}$, the phase frequency detector (PFD) 11 receives a reset signal $PLL_{reset}$ and the divided PLL 10 output frequency signal $F_o/N$. Coupled to the phase frequency detector 11 are the speed-up circuit 12 and the charge pump 13. As those skilled in the art should know, the PFD 11 determines the phase and frequency difference between the reference frequency $F_{ref}$ and the divided PLL 10 output signal FIN. If the PFD 11 detects a difference between the two input signals $F_{ref}$, $F_o/N$, the phase error signals U, D are sent to the speed-up circuit 12 and the charge pump 13. The duration of the output signals U, D pulse widths depend on the amount of phase and frequency error that is detected by the PFD 11.

Figure 3A:
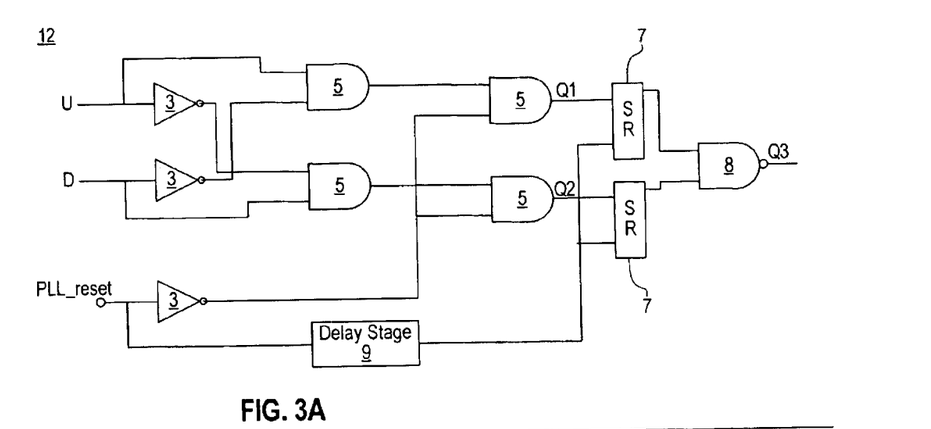
FIG. 3A is a logic gate diagram of the speed-up circuit in accordance with the preferred embodiment of the present invention.

The speed-up circuit 12, shown in FIG. 3A, is controlled by the phase error signals U, D output from the PFD 11. Coupled to the PFD 11 and the charge pump control switch 14, the speed-up circuit 12 receives the phase error signals U, D and a reset signal $PLL_{reset}$. The purpose of the speed-up circuit 12 is to monitor the crossing of the PLL 10 output frequency $F_o/N$ and the reference frequency $F_{ref}$, as will be disclosed hereinafter. The speed-up circuit 12 comprises a plurality of invertors 3, a plurality of AND gates 5, two S-R flip flops 7, a NAND gate 8, and a delay stage 9. Initially, when the PLL circuit 10 receives a reset signal $PLL_{reset}$, the speed-up circuit 12 signals the charge pump control switch 14 to adjust the charge pump 13 current to the maximum. When the speed-up circuit 12 detects the crossing of the two frequencies $F_o/N$, $F_{ref}$, the speed-up circuit 12 signals the charge pump control switch 14 to reduce the charge pump 13 current. The output of the speed-up circuit 12, as the PLL circuit 10 attempts to match the output frequency $F_o/N$ with the reference frequency $F_{ref}$, is illustrated in the state diagram of FIG. 3B and the logic table of FIG. 3C.

Figures 3B, 3C:
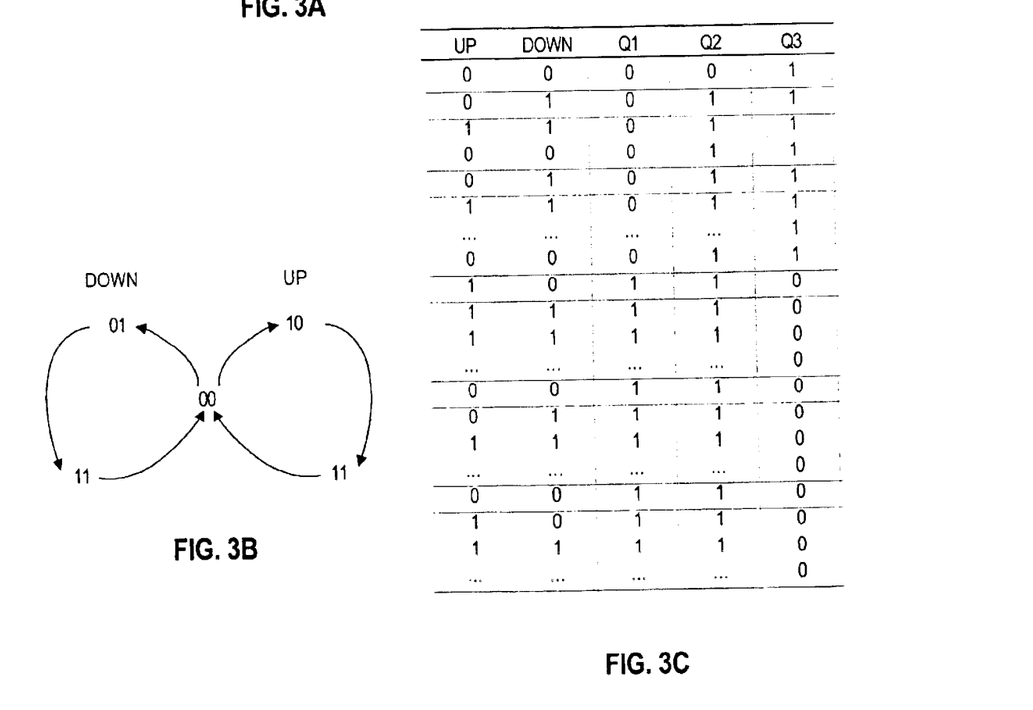
FIG. 3B is a state diagram of the speed-up circuit inputs in accordance with the preferred embodiment of the present invention.
FIG. 3C is a logic table for the speed-up circuit in accordance with the preferred embodiment of the present invention.

Referring to FIGS. 3B and 3C, when the speed-up circuit 12 receives the reset signal $PLL_{reset}$ and the reset PFD 11 outputs U, D, the speed-up circuit 12 signals the charge pump 13 to output its maximum current, thus discharging the loop filter capacitor C1 to 0V. This triggers the VCO 18 to output its maximum frequency $F_o$. The PLL 10 output frequency $F_o/N$ will decrease as the capacitor C1 charges and will eventually be equal to the reference frequency $F_{ref}$. This condition is identified by U, D changing from 00,01,11 to 00,10,11. As the PLL 10 comes out of reset, the signals U, D are in the state 0, 0. Since the PLL 10 output frequency $F_o/N$ is faster than the reference frequency $F_{ref}$, the next state of U, D is 0, 1. This indicates to the charge pump 13 to charge the capacitor C1, reducing the PLL 10 output frequency $F_o/N$. On the next rising edge of the reference frequency $F_{ref}$, the signals U, D go to 1, 1. This state causes the PFD 11 to reset and return U, D to its neutral state 0, 0. This process continues until the PLL 10 output frequency $F_o/N$ is slower than the reference frequency $F_{ref}$. This condition is indicated by the U, D signals going to a state 1, 0. This condition signals the speed-up circuit 12 to output a logical zero (0) $Q_3$ to the charge pump control circuit 14, indicating that the charge pump 13 should reduce its current to the level prescribed by the charge control signal $CC_{signal}$ to be disclosed hereinafter.

The speed-up circuit 12 operates to quickly detect the matching of the reference and output frequencies $F_{ref}$, $F_o/N$, and then output a control signal $Q_3$ to the charge pump control circuit 14 to reduce the current of the charge pump 13 in order to find the optimal bias current range $I_{bias}$, as will be disclosed hereinafter, to be output to the VCO 18. This speed-up circuit 12 provides a fast frequency lock by signaling the initialization of the charge pump 13 current output to its maximum and signaling for the reduction of this current when the frequencies $F_{ref}$ and $F_o/N$ are equal.

Referring back to FIG. 2, the control signal $Q_3$ output from the speed-up circuit 12 is a logical one or a logical zero and is received by the charge pump control circuit 14, which is coupled to the speed-up circuit 12 and the charge pump 13. The charge pump control circuit 14, using a variation of switches, converts the signal from the speed-up circuit 12 and the charge control signal $CC_{signal}$ to logic signals S1, S2, S3, which will adjust the amount of current the charge pump 13 outputs. Initially, when the speed-up circuit 12 indicates that the charge pump 13 should output its maximum current, by outputting a logical one (1) signal $Q_3$, the logic signals S1, S2, S3 will be equivalent to 1, 1, 1, respectively. When the speed-up circuit 12 outputs a logical zero (0) signal $Q_3$, indicating that the charge pump 13 should reduce its current, the logic signals S1, S2, S3 output from the charge pump control circuit 14 will be equivalent to 1, 1, 0 or 1, 0, 1, respectively, for example. This output S1, S2, S3 is set by the charge control signal $CC_{signal}$, an outside input signal whose value depends on the operation for which the PLL 10 output is to be used. The charge pump control circuit 14 converts the charge control signal $CC_{signal}$ to the logic signals S1, S2, S3. This instructs the charge pump 13 to switch out an internal current source (not shown) when the logic signal S1, S2, S3 associated with the current source is zero (0), thereby dividing the current of the charge pump 13 by a number m (e.g., 3, 6, or 9).

The charge pump control circuit 14 provides the PLL 10 with the ability to slew the output frequency $F_o$ toward lock at the fastest rate possible, instead of at a constant rate, using the maximum charge pump 13 output current. As should be well known to those having skill in the art, the faster damping of the PLL 10 output frequency $F_o/N$ is a result of the high frequency response to the error signals U, D from the PFD 11. Once the PLL circuit 10 outputs the desired frequency, the charge pump control circuit 14 reduces the charge pump 13 output current, which reduces the output frequency response of the PLL 10 and improves jitter performance.

The charge pump 13 outputs a current that charges or discharges the capacitors C1, C2 of the loop filter 15 to a voltage level $V_{LPF}$. The charge pump 13 receives the error signals U, D, a voltage input $V_{bp}$ from the common bias generator 16, and the logic signals S1, S2, S3 from the charge pump control circuit 14. $V_{bp}$ is a reference bias voltage which controls the charge pump output current. It is well known to those skilled in the art that the charging and discharging of the loop filter 15 capacitors C1, C2 create a voltage change $V_{LPF}$ across the loop filter 15. As $V_{LPF}$ increases, the charge pump 13 output current decreases. This voltage change $V_{LPF}$ is a reference for the common bias generator 16 and the current control circuit 17 that generates the reference signals for controlling the amount of delay created by each delay element $20_a \ldots 20_n$ of the VCO 18.

The loop filter 15 comprises a first capacitor C1 and a second capacitor C2 with a variable resistor 22. The variable resistor 22 comprises a symmetric load. The loop filter 15 is coupled to the common bias generator 16 as well as the charge pump 13. This loop filter 15 receives a current output generated by the charge pump 13 using the bias voltage $V_{bp}$, and an input voltage $V_{dd}$. As the current from the charge pump 13 shifts to adjust the frequency of the delay cells $20_a \ldots 20_n$, the variable resistor 22 is also adjusted. As those skilled in the art should know, the use of the variable resistor 22 in the loop filter 15 allows the bias generator 16 to maintain stability over a wide bandwidth.

Figure 5:
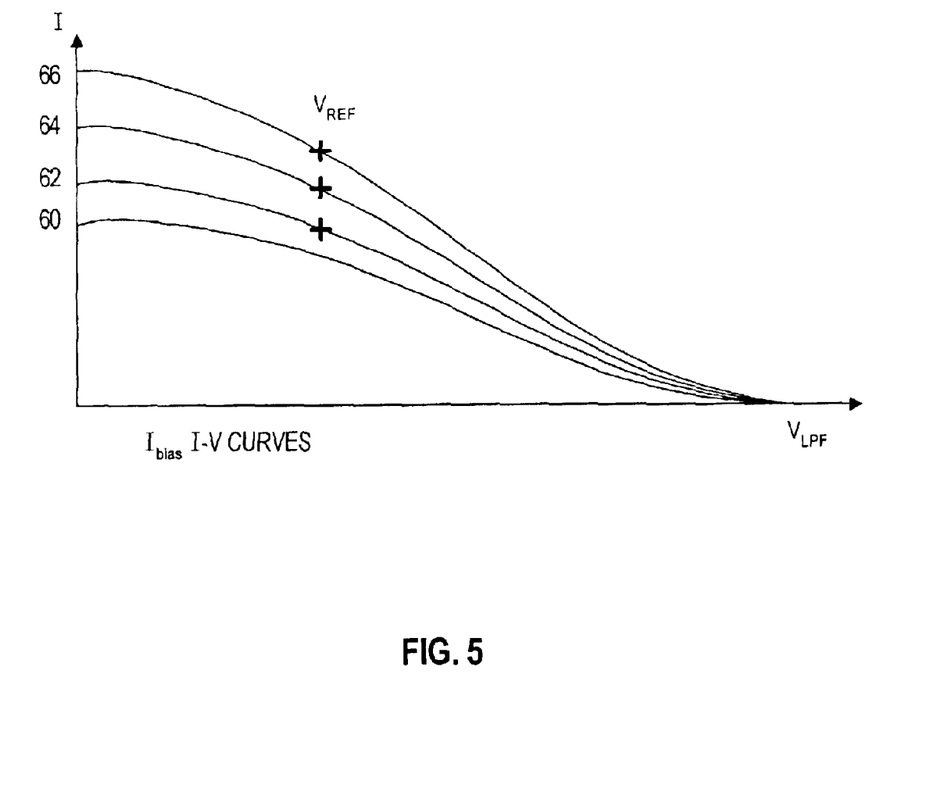
FIG. 5 is an example of a graph of four I-V curves in accordance with one embodiment of the present invention.

The current range control circuit 17, coupled to the loop filter 15 and the bias generator 16, comprises two voltage comparators (not shown) and provides two (2) single bit outputs R0, R1. The current range control circuit 17 receives the loop filter output voltage $V_{LPF}$ and adjusts the level of the bias current $I_{bias}$ generated in the common bias generator 16 through the output leads R0, R1. The voltage comparators in the current range control circuit 17 monitor the voltage $V_{LPF}$ against an internal reference voltage $V_{ref}$, which is indicative of the point where a small change in the voltage $V_{LPF}$ causes a large change in the bias current $I_{bias}$, as disclosed hereinafter. The reference voltage $V_{ref}$, which can be fixed or variable, is illustrated in the FIG. 5 $I_{bias}$ I-V curves 60–66. As those skilled in the art should know, each of these curves 60–66 includes an approximate narrow linear region, illustrated by the curves up to the voltage level $V_{ref}$ in FIG. 5, and a nonlinear region. The nonlinear region, where a small increase in the voltage creates a large decrease in the current, produces a large change in the delay elements $20_a \ldots 20_n$ of the VCO 18, causing increased jitter within the PLL circuit 10. If the PLL circuit 10 is operated past a certain voltage point $V_{ref}$ on the curves, into the nonlinear region, the amount of jitter will increase and the overall performance of the PLL circuit 10 will decrease. Therefore, when the voltage $V_{LPF}$ is greater than the reference voltage $V_{ref}$, PFD 11, speed-up circuit 12, and the charge pump control circuit 14 receive a local reset signal $L_{reset}$ from the current range control circuit 17 which resets the voltage $V_{LPF}$ to zero. The current range control circuit 17 outputs R0, R1 switch, adjusting the bias current $I_{bias}$ to a lower level, as will be described hereinafter.

Figure 4A:
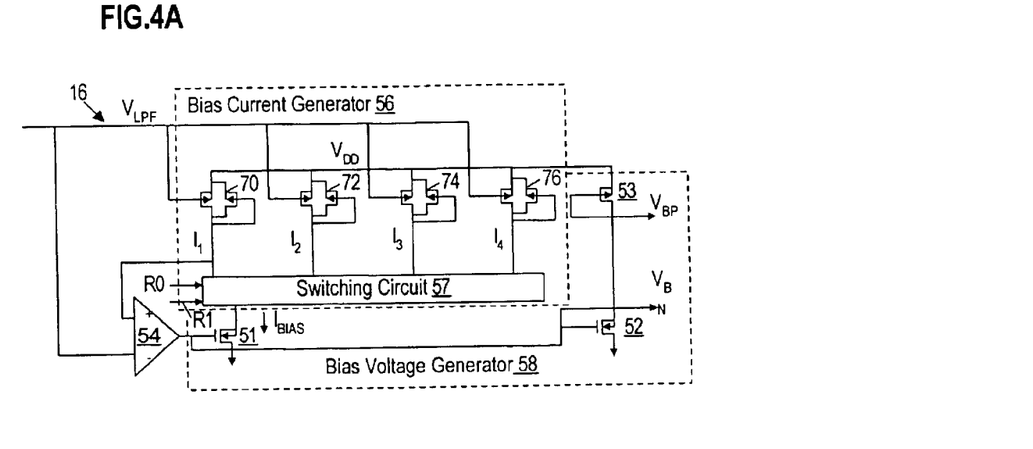
FIG. 4A is a diagram of the bias generator.

Initially, when the PLL circuit 10 is reset, the current range control circuit 17 signals the bias generator 16 to switch on all four currents sources $I_1$, $I_2$, $I_3$, $I_4$, which is indicated by the output 0, 0 for the two outputs R0, R1, respectively (shown in FIG. 4A). When the speed-up circuit 12 detects the crossing of the reference and output frequencies $F_{ref}$, $F_o/N$, the current control circuit 17 is adjusted to find the optimal bias current $I_{bias}$ curve to be utilized by the bias generator 16 for output to the VCO 18. As disclosed above, when the voltage comparators in the current range control circuit 17 detect that $V_{LPF}$ is too high, the current range outputs R0, R1 switch by one (1). For example, after the resetting of the PLL circuit 10, the current range outputs R0, R1 are equivalent to 0, 0. When the comparator detects the high voltage $V_{LPF}$, the current range outputs R0, R1 switch to 0, 1, respectively, which indicates that the common bias generator 16 should switch off current source 14. The current range control circuit 17 also outputs an internal reset signal $L_{reset}$ to the PFD 11, speed-up circuit 12, and the charge pump control circuit 14, which resets the loop filter 15 voltage $V_{LPF}$ to zero (0). Each time the voltage comparators of the loop filter 15 detect this condition, the current range outputs R0, R1 increase by one (1), and another current source is switched off. This process continues until R0, R1 is equivalent to 1, 1, where the only remaining current source is $I_1$. At this point, the current range control circuit 17 signals to the common bias generator 16 to remain at the lowest current level $I_1$.

If the reference voltage $V_{ref}$ is greater than the loop filter voltage $V_{LPF}$, the current range control circuit 17 indicates to the bias generator 16 to remain at the present current level, which is considered the optimal operating point for the process utilizing the output frequency signal $F_o$. As those skilled in the art should know, even though the current range control circuit 17 is illustrated utilizing two (2) single bit outputs R0, R1, a single two-bit output may also be utilized, or any signaling scheme which provides a selective control output.

Figure 4B:
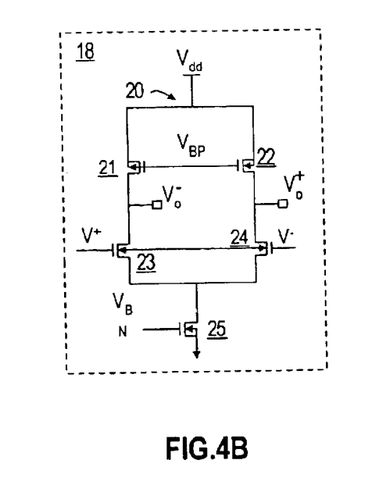
FIG. 4B is a diagram of a delay element of the VCO in accordance with the preferred embodiment of the present invention (only one is shown though there are a plurality of delay cells $20_a \ldots 20_n$ used)

Referring to FIGS. 4A and 4B, the present invention utilizes a single common bias generator 16 comprising a bias current generator 56, a bias voltage generator 58 and a differential amplifier 54. The differential amplifier 54 reduces the noise from the power supply, which improves the power supply rejection ratio performance of the PLL circuit 10. The bias current generator 56 includes four symmetric loads 70, 72, 74, 76 and a switching circuit 57. Each of the symmetric loads 70, 72, 74, 76 (which may or may not have the same device widths), has as its voltage source $V_{dd}$ and the low pass filter 15 output signal $V_{LPF}$ as its gate voltage. The four symmetric loads 70, 72, 74, 76 act as current sources $I_1$, $I_2$, $I_3$, $I_4$. These current sources $I_1$, $I_2$, $I_3$, $I_4$ are switched on and off by the switching circuit 57. The current range control circuit 17 outputs R0, R1 dictate to the switching circuit 57 which of the current sources $I_1$, $I_2$, $I_3$, $I_4$ should be on and which should be off. As should be known to those skilled in the art, there are numerous switching circuits that are responsive to a digital input and can be used as described herein. In this manner, the current range control circuit 17 provides four (4) discrete levels of bias current $I_{bias}$ to control the delay elements $20_a \ldots 20_n$ within the VCO 18. This allows for better control of the PLL circuit 10 by providing the flexibility of varying the current slope without having to vary the delay cell itself. The bias current $I_{bias}$ is output from the bias current generator 56 to the bias voltage generator 58.

The bias voltage generator 58 comprises two n channel transistors 51, 52 and one p channel transistor 53. The gate voltage to n channel transistors 51, 52 is connected to a differential amplifier 54. This differential amplifier 54 eliminates the noise generated by power supply voltage $V_{dd}$. The n channel transistors 51, 52 are configured such that the bias current $I_{bias}$ through transistor 51 is mirrored onto transistor 52 and reflected up to transistor 53. When the bias current $I_{bias}$ is mirrored in this way, two reference voltages are created. The two reference voltages are the bias voltages $V_{bn}$ and $V_{bp}$ which determine the amount of delay for each delay element $20_a \ldots 20_n$ within the VCO 18. Using this common bias generator 16 and a selectable number of delay cells will provide better linearity in the overall delay.

The voltage controlled oscillator (VCO) 18 is coupled to the common bias generator 16 and a frequency divider 19. Although only one delay element $20_a$ is shown for clarity, it should be understood that the VCO 18 includes a plurality of differential delay elements $20_a \ldots 20_n$. The delay elements $20_a \ldots 20_n$ are configured in such a way that the voltage inputs $V^+$, $V^-$ of the delay elements come from the voltage outputs $V_o^+$, $V_o^-$ of the preceding delay elements. The voltage outputs $V_o^+$, $V_o^-$ from the last delay element $20_n$ are feedback to the voltage inputs $V^+$, $V^-$ of the first delay element $20_a$. This configuration generates the desired output frequency $F_o$.

Each delay cell $20_a \ldots 20_n$ contains two p channel transistors 21 and 22 and three n channel transistors 23, 24, 25. Transistors 23, 24 act as switches in the delay cell $20_a$ and determine the actual delay for each element based on the bias current $I_{bias}$ via the voltages $V_{bn}$ and $V_{bp}$. The p channel transistors 21, 22 act as current sources for the transistors 23, 24. Transistor 25 acts as a current source as well. The p channel transistors 21, 22 are biased by the voltage $V_{bp}$. Since the amount of bias current $I_{bias}$ determines the voltage level of $V_{bp}$, the delay element delay time changes with the $V_{bp}$. Transistors 23 and 24 receive a voltage input $V^+$ and $V^-$. The current supplied by transistor 22 does not pass through transistor 24 when transistor 24 is "off" (or not conducting). Likewise, when transistor 23 is not conducting, the current provided by transistor 21 does not pass through transistor 23. There are parasitic capacitances at the inputs of transistors 23 and 24 that charge and discharge to affect the voltages $V^+$ and $V^-$, which rise and fall. When transistors 23 and 24 are on and off, respectively, the charge on the parasitic capacitors at the input of transistors 23 and 24 on the subsequent delay cell will be affected. When transistor 23 is turned on, it discharges the parasitic capacitances of the next delay cell and $V_o^-$ changes from ($V_{dd}$–Vds 21) to (0V+Vds25+Vds23). Likewise, when transistor 24 is off, transistor 22 charges the capacitance of the following delay cell and $V_o^+$ changes from (0V+Vds 25+Vds 24) to ($V_{dd}$–Vds 22), Vds 22 at saturation. As is well known to those skilled in the art, the delay provided by the delay cell is equivalent to the duration between turning on transistor 23 and turning off transistor 24, and when the voltages $V^+$ and $V^-$ are equal. When this point is reached, the transistors in the next delay cell are activated. $V_o^+$ and $V^-$ are the output voltages of each delay cell that provide the input voltages $V^+$, $V^-$ to the next delay cell.

The frequency output from the VCO 18 is then input to a frequency divider 19. Since the output frequency $F_o$ is a multiplied version of the reference frequency $F_{ref}$, by a factor of N times, the frequency divider 19 eliminates this N factor for comparison to the reference frequency $F_{ref}$.

Figure 6:
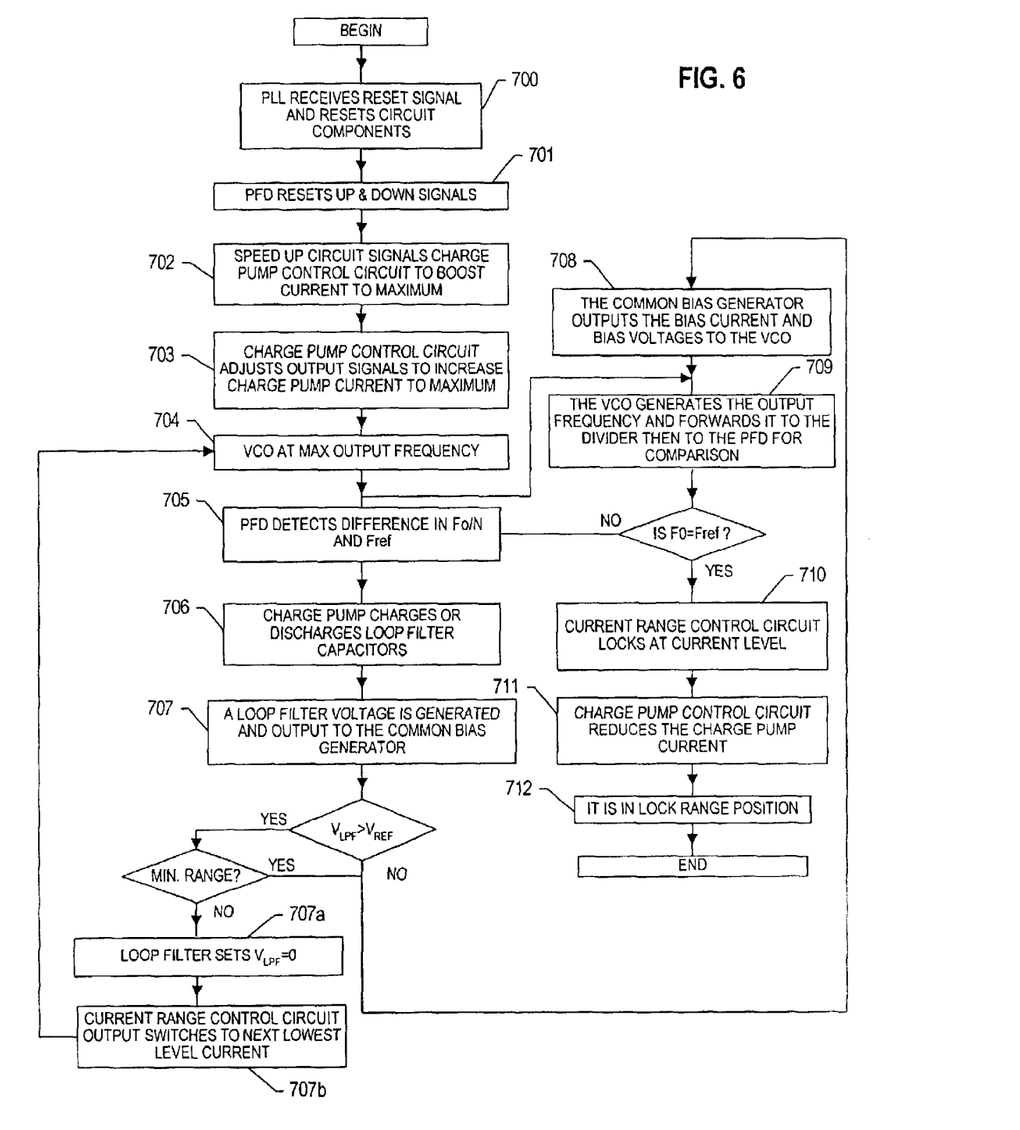
FIG. 6 is a flow diagram in accordance with the preferred embodiment of the present invention.

The flow diagram in accordance with the present invention is illustrated in FIG. 6. The PLL 10 receives a reset signal $PLL_{reset}$, from an external source and resets all PLL circuit 10 components (step 700). Upon receipt of this reset signal $PLL_{reset}$, the PFD 11 resets the up and down output signals U, D (step 701). The speed-up circuit 12 receives the reset signal $PLL_{reset}$ as well as the output signals of the PFD 11 and sends a signal to the charge pump control circuit 14 to boost the current to maximum (step 702). The charge pump control circuit 14, upon receipt of the signal from the speed-up circuit 12, outputs logic signals S1, S2, S3 to the charge pump 13 to adjust the current in the charge pump 13 to its maximum (step 703). The VCO 18 is set to the maximum output frequency (step 704). The maximum output frequency $F_o$ is then forwarded to the frequency divider 19 where it outputs $F_o/N$ to the phase frequency detector 11 for comparison to the reference frequency $F_{ref}$ (step 709). If $F_o/N$ is equal to $F_{ref}$, the current range control circuit 17 locks at the present current level (step 710) and the charge pump control circuit 14 reduces the charge pump 13 current output (step 711). Once the current output of the charge pump 13 is reduced, the PLL circuit 10 is in the lock range position (step 712). If the two frequencies $F_o/N$, $F_{ref}$ are not equal, the PFD 11 outputs signals U, D whose duration depend on the amount of phase and frequency error that is detected between the two frequency signals $F_{ref}$, $F_o/N$ (step 705). The charge pump 13 receives the control signals U, D, S1, S2, S3 from both the PFD 11 and the charge pump control circuit 14 and outputs a current, which sources or sinks the loop filter capacitors C1, C2 (step 706). As a result of the charging or discharging of the loop filter capacitors C1, C2, the control voltage $V_{LPF}$ is generated (step 707). If the loop filter voltage $V_{LPF}$ is greater than $V_{ref}$ and the current range control circuit 17 is not at the minimum current level, the current control circuit 17 outputs a local reset signal $L_{reset}$ to the loop filter 15, which resets the voltage $V_{LPF}$ to zero (0) (step 707a). If the current range control circuit 17 is at the minimum current level, the common bias generator 16 outputs the bias current $I_{bias}$ and bias voltages $V_{bp}$, $V_{bn}$ to the VCO 18 (step 708), which generates the output frequency $F_o$ (step 709). Since the current range control circuit 17 is at its minimum current level 11, the PLL circuit is in the lock range position (step 712). If the current range control circuit 17 is not at its minimum current level $I_1$, the current range control outputs R0, R1 switch to the next lower level (step 707b). Because of the local reset signal of the current range control circuit 17, the VCO is set to its maximum frequency output (step 704). The described process continues until $F_{ref}$ is equal to $F_o/N$.

This design of the PLL circuit 10, in accordance with the preferred embodiment, will achieve a wide operating frequency range with a fast lock up circuit and good jitter performance over a wide power supply voltage range and short lock in time. The differential VCO 18, operating in the biasing current mode, provides a much wider operating frequency range with high common-mode noise immunity. The common biasing technique provides the necessary bias with less sensitivity to temperature and process variations. It also provides better power supply rejection ratio and current range calibration regulation when the power supply droops or when process variations change.

Figure 7:
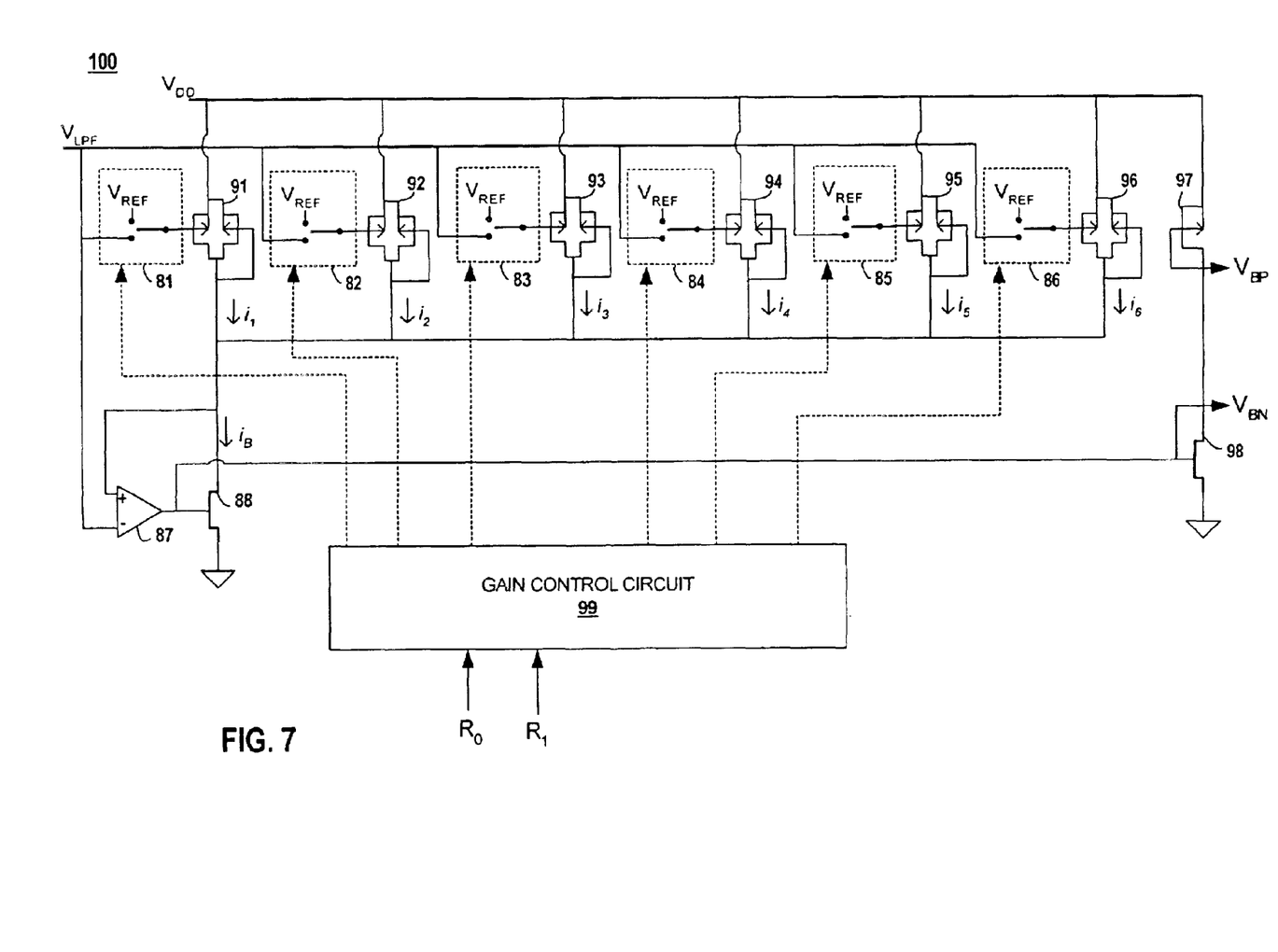
FIG. 7 is a diagram of a bias generator, according to one embodiment of the present disclosure.

Referring now to FIG. 7, a block diagram of a bias generator is shown and referenced generally as bias generator 100, in accordance with one embodiment of the present disclosure. Bias generator 100 includes loads 91–96, switches 81–86, transistors 88, 97, and 98, differential amplifier 87, and gain control circuit 99.

Bias generator 100 operates similar to the bias generator 16 of FIG. 4A. However, wherein the bias currents of the various current levels of the bias generator 16 were set to go to zero, the bias currents of most of the current levels of bias generator 100 are designed to remain with set current limits. Each of the current levels of bias generator 100 allow a smaller range of currents than current levels of bias generator 16. Accordingly, each of the current levels of bias generator 100 have smaller values of gain factors ($K_{VCO}$) than current levels of bias generator 16, when using low source voltages, such as $V_{DD}$ near one volt. The gain factor KVCO represents the resulting conversion factor of the VCO, such as VCO 18, in generating an oscillating signal from input voltage levels. The ability to use smaller $K_{VCO}$ values at higher operational frequencies, without affecting the overall operating range of a PLL, is an advantage in that it results in less jitter than a similar PLL with a larger $K_{VCO}$ value, which would be more sensitive to signal noise. In combination with the current range control circuit 17, the gain control circuit 99 allows a PLL to operate over a much larger range of frequencies than a similar PLL without circuits 17 and 99.

It should be appreciated that the value of $K_{VCO}$ in a particular current level can be calculated and calculations of $K_{VCO}$ are known in the art. For example, the representation of $K_{VCO}$ as described in one embodiment of the present disclosure is based on the following equation, referenced as Equation 1.

$$K_{VCO} = \frac{\frac{dg_m}{dV_{LPF}}}{\frac{(V_H - V_L)}{2} 2NC_L} \qquad \text{(Equation 1)}$$

In Equation 1, $g_m$ refers to the CMOS channel conductance of a symmetric load. $V_{LPF}$ is the voltage value across the low pass filter 15. $V_H$ and $V_L$ are the maximum and minimum values, respectively, of the output ($V^o_+$ and $V_o^-$) of delay cell 20. N represents the number of delay cells 20 that make up the VCO 18, and $C_L$ represents the capacitive load seen by each output of delay cells 20.

Gain control circuit 99 operates similar to switching circuit 57 (FIG. 4A). However, instead of switching on and off current sources from the loads, such as symmetric loads 70, 72, 74 and 76, gain control circuit 99 switches voltage input sources for each of the loads 91–96. While loads of bias generator 16, symmetric loads 70, 72, 74, and 76, were symmetric, loads 91–96 of bias generator 100 are not necessarily symmetric in that different amounts of current can be provided from different loads of loads 91–96. Based on values of R0 and R1, which may be provided by current range control circuit 17, the gain control circuit 99 selects voltages for individual loads of loads 91–96. For each load of loads 91–96, the current range control circuit can provide either a fixed voltage reference $V_{REF}$, $V_{LPF}$ (from low pass filter 15), or $V_{DD}$, as in the following table, Table 1.

TABLE 1

| $R_0$ | $R_1$ | CH1 | CH2 | CH3 | CH4 | CH5 | CH6 |
|---|---|---|---|---|---|---|---|
| 0 | 0 | $V_{LPF}$ | $V_{LPF}$ | $V_{REF}$ | $V_{REF}$ | $V_{REF}$ | $V_{DD}$ |
| 0 | 1 | $V_{DD}$ | $V_{LPF}$ | $V_{LPF}$ | $V_{REF}$ | $V_{REF}$ | $V_{REF}$ |
| 1 | 0 | $V_{DD}$ | $V_{DD}$ | $V_{LPF}$ | $V_{REF}$ | $V_{REF}$ | $V_{DD}$ |
| 1 | 1 | $V_{DD}$ | $V_{DD}$ | $V_{DD}$ | $V_{LPF}$ | $V_{DD}$ | $V_{DD}$ |

As shown in Table 1, for each current range specified by the current range control circuit, either $V_{REF}$, $V_{LPF}$, or $V_{DD}$, can be assigned to each of the specified loads, the loads 91–96 corresponding to channels CH1–CH6 in the table, through the use of switches 81–86, respectively. Setting a voltage input source of $V_{LPF}$ to a particular load allows current generated from the particular load to vary with the $V_{LPF}$ signal. Setting a voltage input source of $V_{REF}$ to a particular load allows the current generated by the particular load to be fixed. Alternatively, the gain control circuit 99 can also disable voltage inputs $V_{LPF}$ and $V_{REF}$ and provide $V_{DD}$ to a particular load, effectively shutting off current generated from that particular load. Fixed current provided by some of the loads of loads 91–96 set a minimum current value for a particular current level, as illustrated in the graph in FIG. 8. It should be noted that the device widths for loads 91–96 may be the same or different for each load. For example, in one embodiment, the device widths for loads 95 and 96 are smaller than the device widths for loads 91–94. Furthermore, it should be appreciated that other methods of providing varying current levels can be used without departing from the scope of the present invention.

Equation 1 can be modified to match combinations of R0 and R1 as shown in Table 1. The following equations, Equations 2–5, illustrate equations to identify values of $K_{VCO}$ for the combinations of values of R0 and R1 shown in Table 1.

$$K_{VCO}(00) = \frac{\frac{dg_{m91}}{dV_{LPF}} + \frac{dg_{m92}}{dV_{LPF}}}{\frac{(V_H - V_L)}{2} 2NC_L}, \text{ where } (R0, R1 = 00) \quad \text{(Equation 2)}$$

$$K_{VCO}(01) = \frac{\frac{dg_{m92}}{dV_{LPF}} + \frac{dg_{m93}}{dV_{LPF}}}{\frac{(V_H - V_L)}{2} 2NC_L}, \text{ where } (R0, R1 = 01) \quad \text{(Equation 3)}$$

$$K_{VCO}(10) = \frac{\frac{dg_{m93}}{dV_{LPF}}}{\frac{(V_H - V_L)}{2} 2NC_L}, \text{ where } (R0, R1 = 10) \quad \text{(Equation 4)}$$

$$K_{VCO}(11) = \frac{\frac{dg_{m94}}{dV_{LPF}}}{\frac{(V_H - V_L)}{2} 2NC_L}, \text{ where } (R0, R1 = 11) \quad \text{(Equation 5)}$$

In equations 2–5, $g_{m91}$, $g_{m92}$, $g_{m93}$ and $g_{m94}$, represent the CMOS channel conductance of symmetric loads 91, 92, 93 and 94, respectively. $V_{LPF}$ is the voltage across the low pass filter 15. $V_H$ and $V_L$ represent the maximum and minimum values, respectively, of the output ($V_o^+$ and $V_o^-$) of delay cell 20. N represents the number of delay cells 20 that make up the VCO 18, and $C_L$ represents the capacitive load seen by each output of delay cells 20.

Figure 8:
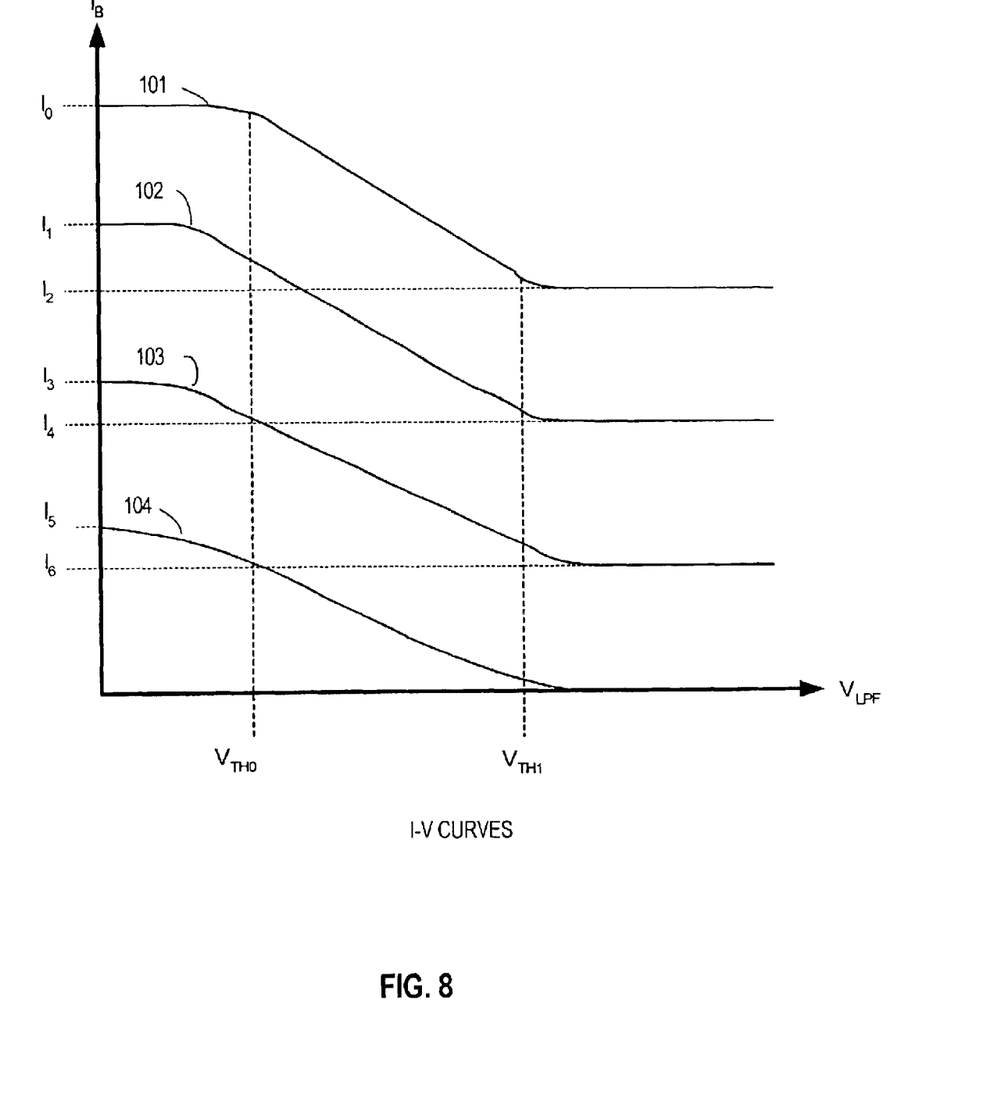
FIG. 8 is an example of a graph of four I-V curves in accordance with one embodiment of the present disclosure.

In the graph of FIG. 8, each of the current levels are shown as I-V curves 101–104. Curve 101 is indicative of a curve from the current level with R0 and R1 having values of 0,0, respectively. Curve 102 is indicative of a curve from the current level with $R_0$ and $R_1$ having values of 0,1, respectively. Curve 103 is indicative of a curve from the current level with $R_0$ and $R_1$ having values of 1,0, respectively. Curve 104 is indicative of a curve from the current level with $R_0$ and $R_1$ having values of 1,1, respectively. Each current level has a fixed range of current. For example, curve 101 only operates a current $I_B$ between $I_0$ and $I_2$. Curve 102 operates with a current $I_B$ between $I_1$ and $I_4$. Curve 103 operates with a current $I_B$ between $I_3$ and $I_6$. The value of $I_B$ is allowed to go to zero in curve 104, wherein the range of $I_B$ is within $I_5$ and zero.

It should be noted that the current levels for each of the curves 101–104 overlap with adjacent curves. For each I-V curve 101–104, the full range of voltage associated with the $V_{LPF}$ is not desirable for use. While $V_{LPF}$ is capable of ranging from the full level of the supplied power level, noise and device limitations result in unreliable values of $K_{VCO}$ near the limits of the power supply (near 0V and the maximum voltage of the power supply $V_{DD}$). For example, it may be desired for transistors associated with the VCO to be in a saturated mode of operation for reliable use. The values of $K_{VCO}$ are unreliable and unstable below a first threshold, $V_{TH0}$, and above a second threshold $V_{TH1}$. Therefore, for each curve 101–103, the usable range of $V_{LPF}$, during which a PLL such as PLL 10 is in a locked mode of operation, is between limits such as $V_{TH0}$ and $V_{TH1}$. The locked mode of operation indicates when the PLL is tracking a reference signal, such as $F_{REF}$. Despite device limitations, the final curve 104 can be allowed to reach zero, regardless of an increase in $V_{LPF}$ greater than the $V_{TH1}$. As previously discussed in reference to the I-V curves of FIG. 5, current range control circuit 17 can monitor the value of $V_{LPF}$ and switch to a next curve when the value of $V_{LPF}$ approaches the value of $V_{TH1}$. Once the current range control circuit 17 switches to a next current range, a reset signal, $L_{reset}$ is provided to reset $V_{LPF}$ to zero. $V_{LPF}$ then ramps up in voltage as the VCO is operated in the next current range. It should be noted that while the same limits are shown for each of the curves 101–104, different limits can be used for each of the curves, without departing from the scope of the present invention.

Based on the current ranges of $I_B$, the VCO can generate a particular range of frequencies. As portions of the full range of voltage for $V_{LPF}$ are not usable with a single current range, the current ranges associated with adjacent curves 101–104 overlap. For example, the highest current limit for curve 102 is $I_1$, which is within the current range of curve 101. Similarly, the highest current for curve 103 is $I_3$, which is within the current range of curve 102. Accordingly, ranges of frequencies generated by the VCO also overlap for each of the current levels.

Referring back to FIG. 7, differential amplifier 87 operates similar to differential amplifier 54 and removes noise from bias current $I_B$. Bias current $I_B$ is converted to bias voltages $V_{BP}$ and $V_{BN}$, through the use of n-channel transistors 88 and 98 and p-channel transistor 97. The bias voltages, provided to VCO 18, control the gain factor, $K_{VCO}$, of the VCO 18. As $V_{BP}$ and $V_{BN}$ are limited in voltage, dependent on the current limits of $I_B$ in a particular current level, a resultant KVCO does not have to operate for a full range of the supply voltage $V_{DD}$. While prior-art devices forced the $K_{VCO}$ to be used for a full range of current, such as current $I_0$ to zero amps, the bias generator 100 allows a $K_{VCO}$ generated to work in a smaller range while not reducing the operational range of a PLL, such as PLL circuit 10. For example, a $K_{VCO}$ for a first current level, such as the current level associated with curve 101 only has to operate within a current range of $I_0$ and $I_2$. Within each range of current, the VCO 18 operates in a fixed range of frequencies. However, as each of the different current levels can be used, the VCO 18 can still be operated over a full range of frequencies. Conventional low power devices required large $K_{VCO}$s to operate in a full range of desired frequencies. Large $K_{VCO}$s are very susceptible to signal noise and can generate high amounts of jitter. The present embodiment of FIG. 7 allows for smaller subsets of frequencies for small current ranges to be used to allow each KVCO associated with a particular current level to be small while still providing a full range of operation, by switching to other current levels.

While a specific embodiment of the present invention has been shown and described, many modifications and variations can be made by one skilled in the art without departing from the spirit and scope of the invention. The above description serves to illustrate and not limit the particular form in any way.

What is claimed is:

1. A phase locked loop (PLL) circuit, wherein a voltage controlled oscillator is adjusted to generate an output frequency signal which is a selected multiple of an input reference signal, said PLL comprising:
   an oscillator control circuit for increasing and decreasing said output frequency signal;
   a phase and frequency detector for detecting a phase shift and a frequency shift between said reference signal and said output signal and producing an error signal;
   a bias generator responsive based on said error signal such that in a first mode of operation, a first bias current is generated, and in a second mode of operation, a second bias current is generated, wherein the first bias current is used to operate said voltage controlled oscillator in a first current range, including a first current value and a second current value, the first current value being greater than the second current value, and the second bias current is used to operate said voltage controlled oscillator in a second current range including a third current value and a fourth current value, the third current value being greater than the fourth current value, and further wherein the first current range overlaps the second current range, the first current value is outside the second current range, and the fourth current value is outside the first current range.

2. The PLL circuit as in claim 1, wherein the first mode of operation includes a first gain constant value associated with the phase locked loop and the second mode of operation includes a second gain constant value, different from the first gain constant value, associated with the phase locked loop, and further wherein the first gain constant value represents a first frequency for a voltage value and the second gain constant value represents a second frequency, different from the first frequency, for the voltage value.

3. The PLL circuit as in claim 1, wherein said bias current generator further is used in a third operation to generate a third bias current to operate said voltage controlled oscillator in a third current range including a fifth current value and a sixth current value, the fifth current value being greater than the sixth current value, and wherein the fifth current value is within the second current range and the third current range and the sixth current value is outside of the second current range.

4. The PLL circuit as in claim 3, wherein the first current range includes a first gain constant value associated with the phase locked loop, the second current range includes a second gain constant value, different from the first constant value, associated with the phase locked loop, and the third current range, includes a third gain constant, different from the first gain constant value and the second gain constant value, associated with the phase locked loop.

5. The PLL circuit as in claim 3, wherein said bias current generator is further used in a fourth mode of operation to generate a fourth bias current to operate said voltage controlled oscillator in a fourth current range including a seventh current value and an eighth current value, the seventh current value being greater than the eighth current value, and wherein the seventh current value is within the third current range and the fourth current range and the eighth current value are outside of the third current range.

6. The PLL circuit as in claim 1, wherein said oscillator control circuit increases and decreases said output frequency signal initially at a relatively high frequency response.

7. The PLL circuit as in claim 1, further comprising a fast lock circuit, responsive to said error signal, for detecting when said output frequency signal passes said selected multiple of said reference signal, wherein said oscillator control circuit is coupled to said fast lock circuit such that said frequency response is reduced when said reference signal passage is detected.

8. The PLL circuit as in claim 1, further comprising:
   a charge pump, said charge pump for generating a charge current which charges and discharges a loop filter; and
   a charge pump control switch associated with said fast lock circuit and charge pump for reducing said charge current when said reference signal passage is detected, wherein said bias generator is responsive to said charging and discharging of said loop filter.

9. The PLL circuit as in claim 1, further comprising a low pass filter to generate a low pass filter voltage based on the error signal, wherein the mode of operation is based on the value of the low pass filter voltage to a value of a fixed reference voltage source.

10. The PLL circuit as in claim 9, wherein the PLL is operated in the first mode of operation prior to operation in the second mode of operation.

11. The PLL circuit as in claim 1, wherein said bias generator includes a plurality of loads for generating the first bias current and the second bias current.

12. The PLL circuit as in claim 1, wherein, when in the first mode of operation, a first voltage is applied to the first load and a second voltage is applied to the second load to contribute current from the first load and the second load to the first bias current.

13. The PLL circuit as in claim 12, wherein, when in the second mode of operation, the first voltage is applied to the second load and no significant voltage is applied to the first load to contribute current from the second load to the second bias current.

14. The PLL circuit as in claim 12, wherein a value of the first voltage and a value of the second voltage are the same.

15. The PLL circuit as in claim 12, wherein a value of the first voltage and a value of the second voltage are different.

16. The PLL circuit as in claim 12, further comprising a low pass filter to generate a low pass filter voltage based on the error signal, wherein the first voltage is representative of the low pass filter voltage and the second voltage is representative of a fixed reference voltage.

* * * * *

UNITED STATES PATENT AND TRADEMARK OFFICE
CERTIFICATE OF CORRECTION

PATENT NO.    : 6,859,108 B2
DATED         : Febraury 22, 2005
INVENTOR(S)   : Abbasi et al.

It is certified that error appears in the above-identified patent and that said Letters Patent is hereby corrected as shown below:

Column 12,
Line 38, replace "claim 1" with -- claim 11 --.

Signed and Sealed this

Seventeenth Day of May, 2005

JON W. DUDAS
*Director of the United States Patent and Trademark Office*